(12) United States Patent
Tando

(10) Patent No.: US 12,195,567 B2
(45) Date of Patent: Jan. 14, 2025

(54) TERMINALLY MODIFIED POLYBUTADIENE, RESIN COMPOSITION FOR METAL-CLAD LAMINATES, PREPREG, AND METAL-CLAD LAMINATE

(71) Applicant: NIPPON SODA CO., LTD., Tokyo (JP)

(72) Inventor: Izumi Tando, Chiba (JP)

(73) Assignee: NIPPON SODA CO., LTD., Tokyo (JP)

( * ) Notice: Subject to any disclaimer, the term of this patent is extended or adjusted under 35 U.S.C. 154(b) by 305 days.

(21) Appl. No.: 17/779,320

(22) PCT Filed: Nov. 25, 2020

(86) PCT No.: PCT/JP2020/043816
§ 371 (c)(1),
(2) Date: May 24, 2022

(87) PCT Pub. No.: WO2021/106931
PCT Pub. Date: Jun. 3, 2021

(65) Prior Publication Data
US 2023/0002532 A1    Jan. 5, 2023

(30) Foreign Application Priority Data

Nov. 29, 2019   (JP) .............................. 2019-216308

(51) Int. Cl.
| | |
|---|---|
| C08F 236/06 | (2006.01) |
| B32B 5/02 | (2006.01) |
| B32B 15/14 | (2006.01) |
| B32B 15/20 | (2006.01) |
| C08J 5/24 | (2006.01) |

(52) U.S. Cl.
CPC .............. *C08F 236/06* (2013.01); *B32B 5/02* (2013.01); *B32B 15/14* (2013.01); *B32B 15/20* (2013.01); *C08J 5/249* (2021.05); *B32B 2250/02* (2013.01); *B32B 2260/021* (2013.01); *B32B 2260/046* (2013.01); *B32B 2262/101* (2013.01); *B32B 2307/204* (2013.01); *B32B 2307/306* (2013.01); *B32B 2307/732* (2013.01); *B32B 2307/748* (2013.01); *C08F 2810/40* (2013.01); *C08J 2347/00* (2013.01)

(58) Field of Classification Search
CPC ... H05K 2201/0215; H05K 2201/0278; H05K 2201/029; H05K 3/022; C08J 2347/00; C08J 5/24; C08J 5/249; C08J 2309/00; C08J 2315/00; C08K 5/14; C08K 5/54; C08F 236/06; C08F 2810/40; C08L 15/00; B32B 5/02; B32B 15/08; B32B 15/14; B32B 15/20; B32B 27/00; B32B 2250/02; B32B 2260/021; B32B 2260/046; B32B 2262/101; B32B 2305/076; B32B 2307/732; B32B 2307/748; C08C 19/22; C08C 19/25
USPC ........................... 524/188, 105, 100, 102, 72
See application file for complete search history.

(56) References Cited

U.S. PATENT DOCUMENTS

| | | |
|---|---|---|
| 2006/0247370 A1 | 11/2006 | Frye et al. |
| 2008/0114098 A1 | 5/2008 | Griswold et al. |
| 2009/0311459 A1 | 12/2009 | Griswold et al. |
| 2018/0100058 A1 | 4/2018 | Pavon Sierra et al. |
| 2018/0118926 A1 | 5/2018 | Haberkorn et al. |
| 2020/0196443 A1* | 6/2020 | Koga ................. B32B 15/08 |
| 2020/0369802 A1 | 11/2020 | Koda |

FOREIGN PATENT DOCUMENTS

| | | |
|---|---|---|
| JP | 61-121699 A | 6/1986 |
| JP | 62-198111 A | 9/1987 |
| JP | 06-128547 A | 5/1994 |
| JP | 06-145380 A | 5/1994 |
| JP | 2000-344949 A | 12/2000 |

(Continued)

OTHER PUBLICATIONS

ISR issued in International Patent Application No. PCT/JP2020/043816, Feb. 9, 2021, translation.

*Primary Examiner* — Camie S Thompson
(74) *Attorney, Agent, or Firm* — GREENBLUM & BERSTEIN, P.L.C.

(57) ABSTRACT

Provided is a novel resin composition for a metal-clad laminate, with which a metal-clad laminate having excellent adhesion with a metal foil, solder heat resistance, insulation and the like can be produced. A terminally modified polybutadiene contained in the resin composition for a metal-clad laminate according to the present invention has a structure of formula (III) on each of both terminals of a polybutadiene comprising a repeating unit of formula (I) and a repeating unit of formula (II), wherein a proportion of the repeating unit of formula (I) in all the repeating units is 70 to 99% by mol.

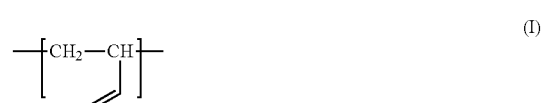

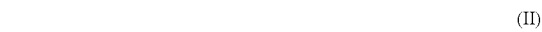

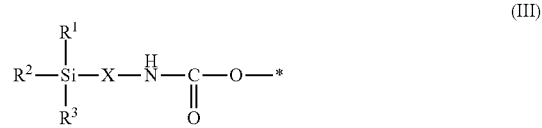

8 Claims, No Drawings

(56) References Cited

FOREIGN PATENT DOCUMENTS

| | | | |
|---|---|---|---|
| JP | 2002-226681 | A | 8/2002 |
| JP | 2002-265782 | A | 9/2002 |
| JP | 2005-002226 | A | 1/2005 |
| JP | 2015-083649 | A | 4/2015 |
| JP | 2017-115020 | A | 6/2017 |
| JP | 2018-515658 | A | 6/2018 |
| JP | 2018-165340 | A | 10/2018 |
| JP | 6581746 | B | 9/2019 |
| JP | 2002-226680 | A | 8/2020 |
| TW | 200846033 | A | 12/2008 |
| TW | 201842062 | A | 12/2018 |
| TW | 201927832 | * | 7/2019 |

* cited by examiner

TERMINALLY MODIFIED POLYBUTADIENE, RESIN COMPOSITION FOR METAL-CLAD LAMINATES, PREPREG, AND METAL-CLAD LAMINATE

TECHNICAL FIELD

The present invention relates to a terminally modified polybutadiene. The present invention also relates to: a resin composition for a metal-clad laminate, containing the terminally modified polybutadiene; a prepreg having a base material impregnated with the resin composition for a metal-clad laminate; and a metal-clad laminate including the prepreg. The present application claims priority of Japanese Patent Application No. 2019-216308, filed on Nov. 29, 2019, the contents of which are hereby incorporated by reference.

BACKGROUND ART

For electronic devices such as personal computers and mobile terminals, materials called copper-clad laminates are used. The copper-clad laminates are materials produced by impregnating a glass cloth fabricated of glass fibers with a vanish containing a resin such as epoxy as a main component, and thereafter laminating copper foils on both sides thereof, and having a lamination structure. In recent years, with an advance in the capacity increase of signals for electric devices, resin materials to be used for copper-clad laminates are required to have dielectric characteristics such as low dielectric constants and low dielectric loss tangents, which are necessary for high-speed communication. The resin materials also need high adhesion with copper foils and high solder heat resistance.

As resin compositions which may be used for copper-clad laminates, various resin compositions are proposed. For example, Patent Document 1 proposes a thermosetting resin composition containing (A) a copolymer resin having a structural unit originated from an aromatic vinyl compound and a structural unit originated from maleic anhydride, (B) a both-molecular terminal hydroxyl group-terminated epoxy-modified polybutadiene, (C) an active ester compound and (D) one or more selected from the group consisting of maleimide compounds and modified substances thereof.

Patent Document 2 proposes a thermosetting resin composition containing (A) a copolymer resin having a structural unit originated from an aromatic vinyl compound and a structural unit originated from maleic anhydride, (B) an epoxy-modified polybutadiene having hydroxyl groups and (C) a maleimide compound.

Patent Document 3 proposes a flame-retardant epoxy resin composition containing (A) an epoxidized polybutadiene compound as an essential component, and containing, for example, a polyfunctional cresol novolac epoxy resin, a polyfunctional brominated epoxy resin, and a triazine-modified cresol novolac resin and further a large amount of flame-retardant inorganic fillers.

Patent Document 4 proposes a resin composition having excellent heat resistance, dielectric characteristics and water absorption, by using the resin composition containing a cyanate resin and an epoxy-modified polybutadiene resin in combination.

Patent Document 5 proposes a heat-resistant resin composition containing, as essential components, (A) a specific benzocyclobutene resin or a prepolymer thereof, (B) an epoxy-modified polybutadiene resin, (C) a halogenated epoxy resin and (D) a curing agent having a reaction group reactive with the epoxy group.

Patent Document 6 proposes a heat-resistant resin composition containing, as essential components, (A) a specific benzocyclobutene resin or a prepolymer thereof, (B) an epoxy-modified polybutadiene resin and (C) an aromatic amine compound containing one or more halogen atoms in the molecule.

Patent Document 7 proposes a curable resin composition having a low thermal expansion coefficient, and containing a copolymer constituted of a conjugated dienic polymer block and an N-substituted maleimide polymer block, a thermosetting resin and a silicon-modified polybutadiene.

Patent Document 8 proposes an adhesive for a copper foil for a copper-clad laminate, comprising a resin composition containing a polyvinyl butyral resin, an epoxy resin and a curing agent thereof, and an amino resin, and comprising an acidic curing agent for crosslinking these components.

Meanwhile, polymers modified with a structure containing Si atoms are known.

For example, Patent Document 9 describes a linear modified dienic polymer having a functional group of the following formula (1) only on one terminal thereof wherein the average number of the functional groups per one molecule is 0.8 to 1. It seems that by making the modified dienic polymer to be contained in a rubber composition, the dispersion state of fillers in a crosslinked substance obtained from the composition may be made to be an ideal state for improving physical properties.

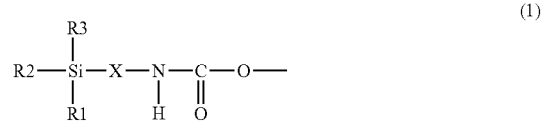

Patent Document 10 describes a silane-modified polybutadiene which may be obtained by reacting a hydroxyl-terminated polybutadiene produced by free radical polymerization with one or more kinds of organosilane compound. It seems that the silane-modified polybutadiene may improve the rolling resistance of diene rubber tires.

Patent Document 11 describes a modified liquid dienic polymer which has at least one group of the general formula (1) in the molecule and whose main chain consists of a dienic polymer chain of 4,000 to 50,000 in number-average molecular weight. It seems that by using the modified liquid dienic polymer, there may be provided a rubber composition simultaneously satisfying both of the wet road brake performance and the rolling resistance performance.

Patent Document 12 describes a polymeric silane coupling agent in which a mercaptosilane is added to a butadienic polymer. There is also proposed a rubber composition for an automobile tire tread, containing a conjugated elastomer which contains the polymeric silane coupling agent and a filler consisting of silica and carbon black.

PRIOR ART DOCUMENTS

Patent Documents

Patent Document 1: Japanese unexamined Patent Application Publication No. 2018-165340
Patent Document 2: Japanese unexamined Patent Application Publication No. 2017-115020
Patent Document 3: Japanese unexamined Patent Application Publication No. 2005-2226
Patent Document 4: Japanese unexamined Patent Application Publication No. 2002-265782
Patent Document 5: Japanese unexamined Patent Application Publication No. 2002-226680
Patent Document 6: Japanese unexamined Patent Application Publication No. 2002-226681
Patent Document 7: Japanese unexamined Patent Application Publication No. 06-145380
Patent Document 8: Japanese unexamined Patent Application Publication No. 06-128547
Patent Document 9: Japanese Patent No. 6581746
Patent Document 10: Japanese unexamined Patent Application Publication (Translation of PCT Application) No. 2018-515658
Patent Document 11: Japanese unexamined Patent Application Publication No. 2015-83649
Patent Document 12: Japanese unexamined Patent Application Publication No. 2000-344949

SUMMARY OF THE INVENTION

Object to be Solved by the Invention

In some cases, metal-clad laminates produced from conventionally known resin compositions for a metal-clad laminate may have insufficient adhesion with metal foils, solder heat resistance and insulation. An object of the present invention is to provide a novel resin composition for a metal-clad laminate, with which a metal-clad laminate having excellent adhesion with a metal foil, solder heat resistance, insulation and the like can be produced.

Means to Solve the Object

As a result of exhaustive studies to solve the above object, the present inventor has found a terminally modified polybutadiene comprising: a polybutadiene in which a proportion of the 1,2-bond structure in all the repeating units is 70 to 99% by mol; and a structure comprising a specific trialkoxysilyl group on each of both terminals of the polybutadiene. The inventor has also found a resin composition for a metal-clad laminate, comprising the terminally modified polybutadiene. Further, the inventor has also found a prepreg and a metal-clad laminate including the resin composition for a metal-clad laminate.

That is, the present invention includes the following aspects.

(1) A terminally modified polybutadiene, comprising: a polybutadiene comprising a repeating unit of formula (I):

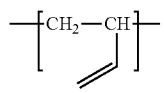

(I)

and a repeating unit of formula (II):

(II)

wherein a proportion of the repeating unit of formula (I) in all the repeating units is 70 to 99% by mol; and a structure of formula (III) on each of both terminals of the polybutadiene:

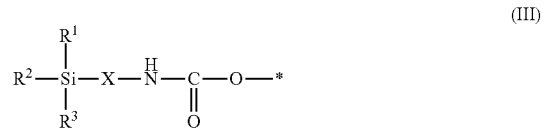

(III)

(wherein $R^1$, $R^2$ and $R^3$ each independently represent an alkoxy group, an aryloxy group, an alkyl group or an aryl group; X represents a linkage group; and represents a bonding site; provided that at least one of $R^1$, $R^2$ and $R^3$ is an alkoxy group or an aryloxy group).

(2) The terminally modified polybutadiene according to (1), wherein the terminally modified polybutadiene has a weight-average molecular weight (Mw) of 1,000 to 100,000.

(3) The terminally modified polybutadiene according to (1) or (2), wherein the terminally modified polybutadiene has a molecular weight distribution (Mw/Mn) of 1.00 to 3.00.

(4) A resin composition for a metal-clad laminate, comprising the terminally modified polybutadiene according to any one of (1) to (3).

(5) The resin composition for a metal-clad laminate according to (4), further comprising an organic peroxide.

(6) The resin composition for a metal-clad laminate according to (5), wherein the organic peroxide is contained in 1 to 5 parts by weight with respect to 100 parts by weight of the terminally modified polybutadiene.

(7) A prepreg, comprising a base material impregnated with the resin composition for a metal-clad laminate according to any one of (4) to (6).

(8) A metal-clad laminate, being produced by laminating and forming the prepreg according to (7) and a metal foil.

Effect of the Invention

By using the resin composition for a metal-clad laminate according to the present invention, a metal-clad laminate having excellent adhesion with a metal foil, solder heat resistance and insulation can be produced.

Mode of Carrying Out the Invention (Terminally Modified Polybutadiene)

The terminally modified polybutadiene according to the present invention has a structure of the following formula (III) on both terminals of a polybutadiene. The "polybutadiene" in the present invention is a polymer compound made by polymerizing butadiene. The "polybutadiene" in the present invention has a repeating unit (hereinafter, described as "1,2-bond" in some cases) of the following formula (I)

and a repeating unit (hereinafter, described as "1,4-bond" in some cases) of the following formula (II). In the "polybutadiene" constituting the terminally modified polybutadiene according to the present invention, the proportion of the repeating unit of formula (I) in all the repeating units is preferably 70 to 99% by mol, more preferably 75 to 99% by mol and still more preferably 80 to 99% by mol. The "polybutadiene" optionally comprises, as repeating units other than the repeating unit of formula (I) and the repeating unit of formula (II), a repeating unit made by hydrogenating the repeating unit of formula (I) and a repeating unit made by hydrogenating the repeating unit of the formula (II).

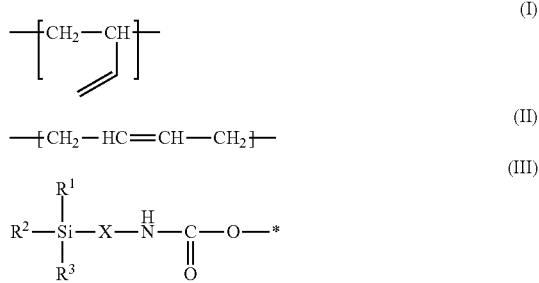

wherein $R^1$, $R^2$ and $R^3$ each independently represent an alkoxy group, an aryloxy group, an alkyl group or an aryl group; provided that at least one of $R^1$, $R^2$ and $R^3$ is an alkoxy group or an aryloxy group. With at least one of $R^1$, $R^2$ and $R^3$ present as an alkoxy group or an aryloxy group, a covalent bond is formed by a condensation reaction with a hydroxyl group of a metal surface. Thereby, the terminally modified polybutadiene according to the present invention exhibits high adhesion with the metal.

As the alkoxy group in $R^1$, $R^2$ and $R^3$, a methoxy group, an ethoxy group, a n-propoxy group, an i-propoxy group, a n-butoxy group, a s-butoxy group, an i-butoxy group, a t-butoxy group or the like may be exemplified. Among these, C1-6 alkoxy groups are preferable, and a methoxy group and an ethoxy group are more preferable.

As the aryloxy group in $R^1$, $R^2$ and $R^3$, a phenoxy group, a naphthoxy group or the like may be exemplified. Among these, C6-10 aryloxy groups are preferable and a phenoxy group is more preferable.

As the alkyl group in $R^1$, $R^2$ and $R^3$, a methyl group, an ethyl group, a n-propyl group, an i-propyl group, a n-butyl group, a s-butyl group, an i-butyl group, a t-butyl group, a n-pentyl group, a n-hexyl group or the like may be exemplified. Among these, C1-6 alkyl groups are preferable and a methyl group and an ethyl group are more preferable.

As the aryl group in $R^1$, $R^2$ and $R^3$, a phenyl group, a naphthyl group or the like may be exemplified. Among these, C6-10 aryl groups are preferable and a phenyl group is more preferable.

In the formula (III), X represents a linkage group. As the linkage group, an alkylene group, an alkylene-O-alkylene group or the like may be exemplified.

As the alkylene group, methylene, ethylene, propane-1,3-diyl, propane-1,2-diyl, butane-1,4-diyl, butane-2,3-diyl, pentane-1,5-diyl, pentane-1,4-diyl, 2-methylbutane-1,4-diyl, hexane-1,6-diyl, octane-1,8-diyl, decane-1,10-diyl or the like may be exemplified. Among these, C1-10 alkylene groups are preferable.

The alkylene-O-alkylene group means a group in which an alkylene group and an alkylene group are bonded through an —O— bond. As the alkylene-O-alkylene group, an ethylene-O-ethylene group, an ethylene-O-propane-1,3-diyl group or the like may be exemplified.

In the formula (III), * represents a bonding site.

The molecular weight of the terminally modified polybutadiene according to the present invention is not particularly limited, but may be selected from in the range of, in terms of number-average molecular weight (Mn), 1,000 to 100,000, 1,000 to 80,000, 1,000 to 70,000, 1,000 to 60,000, 1,000 to 50,000, 1,000 to 40,000, 1,000 to 30,000, 1,000 to 20,000, or 1,000 to 10,000.

The molecular weight distribution (Mw/Mn) of the terminally modified polybutadiene according to the present invention is not particularly limited, but may be selected from in the range of 1.00 to 5.00, 1.00 to 4.00, 1.00 to 3.00 or 1.00 to 2.00. Here, the weight-average molecular weight (Mw) and the number-average molecular weight (Mn) are values in terms of molecular weights of standard polystyrenes measured by gel permeation chromatography (GPC) using tetrahydrofuran as a solvent.

(Method for Producing the Terminally Modified Polybutadiene)

Then, a method for producing the terminally modified polybutadiene according to the present invention will be described.

The terminally modified polybutadiene according to the present invention may be produced by reacting a both-terminal hydroxyl group-modified polybutadiene (1) with an isocyanate compound (2) under the condition with a solvent, or without a solvent.

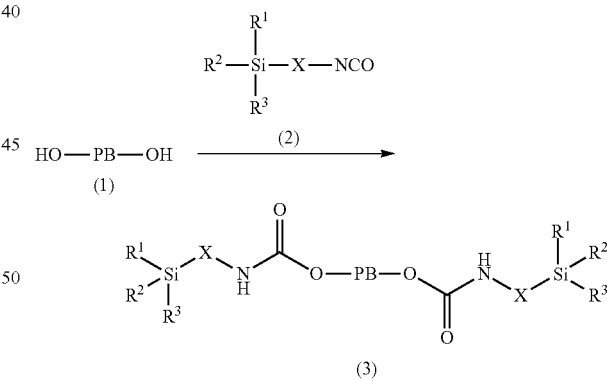

wherein $R^1$, $R^2$, $R^3$ and X are the same as described in the formula (III).

As the both-terminal hydroxyl group-modified polybutadiene, commercially available products may be used. As the commercially available both-terminal hydroxyl group-modified polybutadienes, NISSO-PB G-1000 (manufactured by Nippon Soda Co., Ltd.), NISSO-PB G-2000 (manufactured by Nippon Soda Co., Ltd.), NISSO-PB G-3000 (manufactured by Nippon Soda Co., Ltd.) or the like may be exemplified. These may be used alone or used by combination of two or more thereof.

The terminally modified polybutadiene, if containing metal atoms as impurities, may adversely affect the insulation of the resin composition for a metal-clad laminate according to the present invention in some cases. Hence, it is preferable that the reaction is carried out by using no metal catalyst.

In the case of carrying out the reaction in a solvent, as the solvent to be used in the reaction, an aromatic hydrocarbon such as benzene, toluene or xylene; an ester-based solvent such as methyl acetate, ethyl acetate or n-propyl acetate; an amide-based solvent such as N,N-dimethylformamide, N,N-dimethylacetamide or N-methylpyrrolidone; an ether-based solvent such as diethyl ether, tetrahydrofuran, 1,2-dimethoxyethane or 1,4-dioxane; a nitrile-based solvent such as acetonitrile or benzonitrile; dimethyl sulfoxide; a phosphoric amide-based solvent such as hexamethylphosphorous triamide (HMPT) or hexamethylphosphoramide (HMPA); or the like may be exemplified.

The reaction temperature is usually in the range of 0° C. to 100° C. and preferably room temperature to 80° C.; and the reaction is usually completed in several minutes to several hours.

(Resin Composition for a Metal-Clad Laminate)

The resin composition for a metal-clad laminate according to the present invention comprises the terminally modified polybutadiene according to the present invention.

The content of the terminally modified polybutadiene in the resin composition for a metal-clad laminate according to the present invention is not particularly limited, but may be 10 to 90% by weight or the like with respect to the total weight of the resin composition for a metal-clad laminate.

The resin composition for a metal-clad laminate according to the present invention may comprise an organic peroxide. The content of the organic peroxide is not particularly limited, but is preferably 1 to 5 parts by weight with respect to 100 parts by weight of the terminally modified polybutadiene. As the organic peroxide, dicumyl peroxide, di-t-butylperoxy-3,3,5-trimethylcyclohexane, α,α'-di-t-butylperoxy-di-p-diisopropylbenzene, n-butyl-4,4-bis-t-butyl peroxyvalerate, t-butyl peroxybenzoate, t-butyl peroxyisopropylcarbonate, 2,5-dimethyl-2,5-di(t-butylperoxy) hexane or the like may be exemplified. Among these, dicumyl peroxide is preferable.

(Other Additives)

To the resin composition for a metal-clad laminate according to the present invention, other additives may suitably be added as long as the advantageous effects of the present invention are not impaired. As the other additives, a crosslinking agent, a flame retardant, an inorganic filler, a solvent and the like may be exemplified.

As the crosslinking agent, it is not particularly limited, but divinylbenzene, triallyl isocyanurate or the like may be exemplified.

In the case of adding the crosslinking agent, the amount thereof to be added is not particularly limited, but may be 1 to 50% by weight with respect to the terminally modified polybutadiene according to the present invention.

As the flame retardant, it is not particularly limited, but a halogen-based flame retardant such as a bromine-based flame retardant, a phosphorus-based flame retardant or the like may be exemplified.

As the halogen-based flame retardant, a bromine-based flame retardant such as pentabromodiphenyl ether, octabromodiphenyl ether, decabromodiphenyl ether, tetrabromobisphenol A or hexabromocyclododecane, or a chlorine-based flame retardant such as chlorinated paraffin, or the like may be exemplified.

As the phosphorus-based flame retardant, a phosphate ester such as a condensed phosphate ester or a cyclic phosphate ester, a phosphazene compound such as a cyclic phosphazene compound, a phosphinate salt-based flame retardant such as a dialkylphosphinic acid aluminum salt, a melamine-based flame retardant such as melamine phosphate or a melamine polyphosphate, or the like may be exemplified.

In the case of adding the flame retardant, the amount thereof to be added is not particularly limited, but may be 1 to 20% by weight with respect to the terminally modified polybutadiene according to the present invention.

As the inorganic filler, silica, alumina, talc, aluminum hydroxide, magnesium hydroxide, titanium oxide, mica, aluminum borate, barium sulfate, calcium carbonate or the like may be exemplified.

In the case of adding the inorganic filler, the amount thereof to be added is not particularly limited, but may be 10 to 150% by weight with respect to the terminally modified polybutadiene according to the present invention.

A method for producing the resin composition for a metal-clad laminate according to the present invention is not particularly limited. As the method, there may be exemplified a method in which after other components are added to the terminally modified polybutadiene according to the present invention, the mixture is kneaded by a kneader.

(Prepreg)

When a prepreg is produced, the resin composition for a metal-clad laminate according to the present invention is used, in many cases, by being prepared as a vanish for the purpose of impregnating a base material (fibrous base material) to form the prepreg with the vanish. Such a resin vanish is prepared, for example, as follows.

First, each component dissolvable in an organic solvent is added and dissolved in the organic solvent. At this time, as required, it may be heated. Thereafter, components which are used as needed and are not dissolved in the organic solvent, for example, an inorganic filler and the like are added and dispersed until assuming a predetermined dispersion state by using a ball mill, a bead mill, a planetary mixer, a roll mill or the like, to thereby prepare the resin vanish.

As a method for producing the prepreg by using the obtained resin vanish, a method of impregnating a fibrous base material with the obtained resin vanish and thereafter drying the resultant may be exemplified.

As the fibrous base material to be used for the production of the prepreg, glass cloth, aramid cloth, polyester cloth, glass nonwoven fabric, aramid nonwoven fabric, polyester nonwoven fabric, pulp paper, linter paper or the like may specifically be exemplified.

By heating the fibrous base material impregnated with the resin vanish in a desired heating condition, for example, 80 to 170° C. for 1 to 10 min to remove the solvent, the prepreg in a semi-cured state (B stage) can be obtained.

(Metal-Clad Laminate)

One or more sheets of the obtained prepreg are stacked; and on upper and lower both surfaces or one surface thereof, a metal foil such as a copper foil is stacked and subjected to heating and pressure forming to be laminated and integrated to thereby fabricate a double-sided metal foil-clad or a single-sided metal foil-clad laminate.

The heating and pressurizing condition may suitably be set according to the thickness of the laminate to be produced, the kind of the resin composition of the prepreg, and the like. For example, the temperature may be set at 170 to 210° C.; the pressure, at 1.5 to 4.0 MPa; and the time, for 60 to 150 min.

EXAMPLES

Hereinafter, the present invention will be described in detail by way of Examples, but the present invention is not limited to the scope of the Examples.

Synthesis of Terminally Modified Polybutadienes

Production Example 1

100 g of NISSO-PB G-1000 (hydroxyl value: 73.0 mgKOH/g) was put in a 200-mL flask. 24.04 g of 3-isocyanatopropyltrimethoxysilane was added thereto so as to become 0.9 mol time the number of moles corresponding to the hydroxyl value of G-1000. The resultant was heated up to 60° C. under full stirring to be reacted for 12 hours to thereby obtain a terminally modified polybutadiene A. The obtained terminally modified polybutadiene A had a number-average molecular weight (Mn) of 3,200 and a molecular weight distribution (Mw/Mn) of 2.24. Here, the weight-average molecular weight (Mw) and the number-average molecular weight (Mn) were values in terms of molecular weights of standard polystyrenes measured by gel permeation chromatography (GPC) using tetrahydrofuran as a solvent.

Production Example 2

100 g of NISSO-PB G-3000 (hydroxyl value: 31.0 mgKOH/g) was put in a 200-mL flask. 10.21 g of 3-isocyanatopropyltrimethoxysilane was added thereto so as to become 0.9 mol time the number of moles corresponding to the hydroxyl value of G-3000. The resultant was heated up to 60° C. under full stirring to be reacted for 12 hours to thereby obtain a terminally modified polybutadiene B. The obtained terminally modified polybutadiene B had a number-average molecular weight (Mn) of 6,700 and a molecular weight distribution (Mw/Mn) of 1.57. Here, the weight-average molecular weight (Mw) and the number-average molecular weight (Mn) were values in terms of molecular weights of standard polystyrenes measured by gel permeation chromatography (GPC) using tetrahydrofuran as a solvent.

Production Example 3

A both-terminal hydroxyl group-modified 1,4-polybutadiene was synthesized by using a radical initiator, with reference to Polymer Synthesis (Vol. 1), edited by Takeshi Endo, 1st Edition, Kodansha Ltd., 2010 (in Japanese). The synthesized 1,4-polybutadiene had an Mn of about 5,000, a 1,2-vinyl ratio of about 20% and a hydroxyl value of about 48 mgKOH/g.

100 g of the 1,4-polybutadiene (hydroxyl value: 48.0 mgKOH/g) synthesized in the above was put in a 200-mL flask. 15.81 g of 3-isocyanatopropyltrimethoxysilane was added thereto so as to become 0.9 mol time the number of moles corresponding to the hydroxyl value of the 1,4-polybutadiene. The resultant was heated up to 60° C. under full stirring to be reacted for 12 hours to thereby obtain a terminally modified polybutadiene C. The obtained terminally modified polybutadiene C had a number-average molecular weight (Mn) of 6,000 and a molecular weight distribution (Mw/Mn) of 2.10. Here, the weight-average molecular weight (Mw) and the number-average molecular weight (Mn) were values in terms of molecular weights of standard polystyrenes measured by gel permeation chromatography (GPC) using tetrahydrofuran as a solvent.

Fabrication of Metal-Clad Laminates

Example 1

The terminally modified polybutadiene A, the solvent and the organic peroxide in proportions indicated in Table 1 were mixed to thereby obtain a vanish. A glass cloth was dipped in the vanish to impregnate the glass cloth with the resin. Thereafter, the vanish-impregnated glass cloth was dried at 150° C. for 10 min to thereby obtain a prepreg. The mat surface of a copper foil of 18 μm in thickness was laminated on one surface of the prepreg. Thereafter, the resultant was heated at 195° C. for 120 min under a pressure of 3 MPa to thereby obtain a metal-clad laminate.

TABLE 1

|  | Example | | Comparative Example | | | |
|---|---|---|---|---|---|---|
|  | 1 | 2 | 1 | 2 | 3 | 4 |
| Terminally modified polybutadiene A | 100 | — | — | — | — | — |
| Terminally modified polybutadiene B | — | 100 | — | — | — | — |
| Terminally modified polybutadiene C | — | — | 100 | — | — | — |
| B-1000 | — | — | — | 100 | — | — |
| B-3000 | — | — | — | — | 100 | — |
| 1,4-Polybutadiene | — | — | — | — | — | 100 |
| Toluene | 100 | 100 | 100 | 100 | 100 | 100 |
| Dicumyl peroxide | 3 | 3 | 3 | 3 | 3 | 3 |

(Dielectric Constant, Dielectric Loss Tangent)

The dielectric constant and dielectric loss tangent were measured for the resin alone. The dielectric constant and dielectric loss tangent at a measurement frequency of 5 GHz were measured by a probe method. The results are shown in Table 2.

(Peel Strength)

The peel strength was measured according to JIS C6481. The metal-clad laminate was subjected to a 90° C. peel test of the copper foil to measure the peel strength. The result is shown in Table 2.

(Solder Heat Resistance)

The solder heat resistance was measured according to JIS C6481. The copper-clad laminate was dipped in a solder at 260° C. for 2 min and the solder heat resistance was evaluated by observing peeling of the copper foil. The case where no peeling occurred was evaluated as "○"; and the case where peeling occurred, as "x". The results are shown in Table 2.

Example 2

Fabrication of a metal-clad laminate, and tests for measurements of the dielectric constant and dielectric loss tangent and for the peel strength and the solder heat resistance, were carried out as in Example 1, except for using a terminally modified polybutadiene B as the resin component. The results are shown in Table 2.

Comparative Example 1

Fabrication of a metal-clad laminate, and tests for measurements of the dielectric constant and dielectric loss tangent and for the peel strength and the solder heat resistance, were carried out as in Example 1, except for using a terminally modified polybutadiene C as the resin component. The results are shown in Table 2.

Comparative Example 2

Fabrication of a metal-clad laminate, and tests for measurements of the dielectric constant and dielectric loss tangent and for the peel strength and the solder heat resistance, were carried out as in Example 1, except for using NISSO-PB B-1000, which had no functional group on the terminals, as the resin component. The results are shown in Table 2.

Comparative Example 3

Fabrication of a metal-clad laminate, and tests for measurements of the dielectric constant and dielectric loss tangent and for the peel strength and the solder heat resistance, were carried out as in Example 1, except for using NISSO-PB B-3000, which had no functional group on the terminals, as the resin component. The results are shown in Table 2.

Comparative Example 4

Fabrication of a metal-clad laminate, and tests for measurements of the dielectric constant and dielectric loss tangent and for the peel strength and the solder heat resistance, were carried out as in Example 1, except for using the 1,4-polybutadiene synthesized in Production Example 3 as the resin component. The results are shown in Table 2.

The invention claimed is:

1. A terminally modified polybutadiene, comprising: a polybutadiene comprising a repeating unit of formula (I):

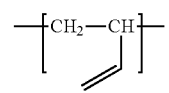

and a repeating unit of formula (II):

wherein a proportion of the repeating unit of formula (I) in all the repeating units is 70 to 99% by mol; and a structure of formula (III) on each of both terminals of the polybutadiene:

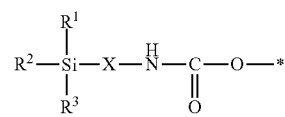

(wherein $R^1$, $R^2$ and $R^3$ each independently represent an alkoxy group, an aryloxy group, an alkyl group or an aryl group; X represents a linkage group; and * represents a bonding site; provided that at least one of $R^1$, $R^2$ and $R^3$ is an alkoxy group or an aryloxy group).

2. The terminally modified polybutadiene according to claim 1, wherein the terminally modified polybutadiene has a weight-average molecular weight (Mw) of 1,000 to 100,000.

3. The terminally modified polybutadiene according to claim 1, wherein the terminally modified polybutadiene has a molecular weight distribution (Mw/Mn) of 1.00 to 3.00.

4. A resin composition for a metal-clad laminate, comprising the terminally modified polybutadiene according to claim 1.

5. The resin composition for the metal-clad laminate according to claim 4, further comprising an organic peroxide.

6. The resin composition for the metal-clad laminate according to claim 5, wherein the organic peroxide is contained in 1 to 5 parts by weight with respect to 100 parts by weight of the terminally modified polybutadiene.

7. A prepreg, comprising a base material impregnated with the resin composition for the metal-clad laminate according to claim 4.

TABLE 2

| | Example 1 | Example 2 | Comparative Example 1 | Comparative Example 2 | Comparative Example 3 | Comparative Example 4 |
|---|---|---|---|---|---|---|
| Copper foil peel strength (N/mm²) | 0.70 | 0.70 | 0.28 | 0.08 | 0.52 | 0.02 |
| Solder heat resistance | ○ | ○ | ○ | ○ | ○ | x |
| Dielectric constant | 2.56 | 2.41 | 2.53 | 2.32 | 2.25 | 2.42 |
| Dielectric loss tangent | 0.030 | 0.015 | 0.029 | 0.027 | 0.014 | 0.026 |

8. A metal-clad laminate, being produced by laminating and forming the prepreg according to claim 7 and a metal foil.

* * * * *